United States Patent
Lerosey et al.

(10) Patent No.: US 11,881,635 B1
(45) Date of Patent: Jan. 23, 2024

(54) ELECTROMAGNETIC ADJUSTABLE ELEMENT AND A WAVE SHAPING DEVICE INCLUDING A PLURALITY OF ELECTROMAGNETIC ADJUSTABLE ELEMENTS

(71) Applicant: GREENERWAVE, Paris (FR)

(72) Inventors: Geoffroy Lerosey, Paris (FR); Arnaud Phelipot, Paris (FR); Gérald Vincent, Paris (FR); Luca Santamaria, Paris (FR); Mikhail Odit, Paris (FR); Najib Mahdi, Paris (FR); Vladimir Lenets, Paris (FR); Uladzislau Papou, Paris (FR)

(73) Assignee: Greenerwave, Paris (FR)

( * ) Notice: Subject to any disclaimer, the term of this patent is extended or adjusted under 35 U.S.C. 154(b) by 0 days.

(21) Appl. No.: 18/197,699

(22) Filed: May 15, 2023

(51) Int. Cl.
  *H01Q 3/46* (2006.01)
  *H03K 17/687* (2006.01)

(52) U.S. Cl.
  CPC ........... *H01Q 3/46* (2013.01); *H03K 17/6871* (2013.01)

(58) Field of Classification Search
  CPC ....................................................... H01Q 3/46
  See application file for complete search history.

(56) References Cited

U.S. PATENT DOCUMENTS

| | | | |
|---|---|---|---|
| 6,538,621 B1 | 3/2003 | Sievenpiper et al. | |
| 7,205,941 B2 * | 4/2007 | Wang | H01Q 3/44 343/909 |
| 11,251,886 B2 * | 2/2022 | Fink | H04W 4/80 |
| 2004/0201526 A1 * | 10/2004 | Knowles | H01Q 3/24 343/700 MS |
| 2017/0164429 A1 * | 6/2017 | Lerosey | H05B 6/705 |
| 2019/0393729 A1 * | 12/2019 | Contopanagos | H02J 50/20 |
| 2022/0201864 A1 * | 6/2022 | Yeh | H01Q 15/10 |

FOREIGN PATENT DOCUMENTS

WO    2015039769 A1    3/2015

OTHER PUBLICATIONS

A. Tomkins et al. (2008). A 94GHz SPST Switch in 65nm Bulk CMOS. 2008 IEEE Compound Semiconductor Integrated Circuits Symposium, 1-4.
J. Gros. (2021). A Reconfigurable Intelligent Surface at mmWave Based on a Binary Phase Tunable Metasurface. IEEE Open Journal of the Communications Society, 2, 1055-1064.
M. Khalil. (2022): Improving Active Elements of Reconfigurable Intelligent Surface. TechRxiv. Preprint. https://doi.org/10.36227/techrxiv.20154422.v1.

(Continued)

*Primary Examiner* — Awat M Salih
(74) *Attorney, Agent, or Firm* — Daylight Law, P.C.

(57) ABSTRACT

An electromagnetic adjustable element that is adapted to change the manner in which an electromagnetic wave is reflected and/or transmitted and/or radiated by said adjustable element, the adjustable element comprising a first electromagnetic element and a second electromagnetic element, and a switch between them. The switch is a transistor structure including transistors of low power type, lower than 20 dBm.

23 Claims, 6 Drawing Sheets

(56) References Cited

OTHER PUBLICATIONS

M. Rossanese et al. (2022). Designing, building, and characterizing RF switch-based reconfigurable intelligent surfaces. In Proceedings of the 16th ACM Workshop on Wireless Network Testbeds, Experimental evaluation & CHaracterization (WINTECH '22). Association for Computing Machinery, New York, NY, USA, 69-76. https://doi.org/10.1145/3556564.3558236.

R. Liu et al. (2022). Simulation and Field Trial Results of Reconfigurable Intelligent Surfaces in 5G Networks. IEEE Access, 10, 122786-122795.

* cited by examiner

ELECTROMAGNETIC ADJUSTABLE ELEMENT AND A WAVE SHAPING DEVICE INCLUDING A PLURALITY OF ELECTROMAGNETIC ADJUSTABLE ELEMENTS

TECHNICAL FIELD

The present invention relates to an electromagnetic adjustable element for a wave shaping device.

BACKGROUND ART

More particularly, the invention relates to an electromagnetic adjustable element designed for a wave shaping device, said adjustable element being adapted to change the manner in which an electromagnetic wave is reflected and/or transmitted and/or radiated, and comprising:
- a first electromagnetic element and a second electromagnetic element made on an adjustable element area that is a portion of a supporting substrate, and
- a switch mounted on the adjustable element area of the supporting substrate, the switch comprising:
- a first port configured to be connected to the first electromagnetic element,
- a second port configured to be connected to the second electromagnetic element,
- a control port configured to be fed by a control signal to control the switch, and
wherein the switch is in a connected state when the antenna is connected to the load, and the switch is in a disconnected state when the antenna is disconnected to the load, so that the electromagnetic wave is reflected or transmitted by said adjustable element depending on the disconnected state or connected state of the switch.

In a radio communication antenna device having a single antenna, a radio frequency switch is usually connected just after the power amplifier. Then, the switch must handle high power (more than 30 dBm) and high isolation. Such radio frequency switch is then rather large in dimension and costly.

Patent publication U.S. Pat. No. 6,538,621 discloses a tunable impedance surface for steering or focusing a radio frequency beam. It comprises for example a ground plane, a plurality of array elements at a short distance from the ground plane, and an arrangement of adjustable capacitors between adjacent array elements.

In such tunable impedance surface, large numbers of electromagnetic adjustable elements are necessary and independently controlled to shape the reflection, transmission or radiation of an electromagnetic wave. Typically, more than one hundred (100) of the electromagnetic adjustable elements are needed.

Radio frequency switches, which are commonly-used in other applications, are then never used as the adjustable elements, and usually P-I-N diodes (diodes polarized by an input voltage to open or close a circuit), adjustable capacitors as in above prior art document, varicaps, MEMS, liquid crystals, mechanical switches, are used.

Therefore, all these tunable impedance surfaces are very costly to produce because of the huge number of costly switches used therein.

BRIEF DESCRIPTION OF THE INVENTION

The present invention aims to develop a low cost adjustable element.

A first object of the invention relates to an electromagnetic adjustable element in which the switch is a transistor structure including transistors of low power type, said power being lower than 20 dBm.

A switch of such low power type does not currently exist on the commercial market and is specifically developed for the above electromagnetic adjustable element use.

By these arrangements, the electromagnetic adjustable element is less costly than prior art devices because the adjustable element includes low cost transistors and a limited number of transistors.

Moreover, the electromagnetic adjustable element and the switch have a reduced size, which also contribute highly to reduce the cost of the electromagnetic adjustable element.

In various embodiments of the wave shaping device, one or more of the following arrangements may be used.

In one aspect, the transistors of transistor structure are of MOSFET type, or CMOS type, or bipolar-CMOS type.

In one aspect, the switch has a switch area on the supporting substrate of less than 1.5 $mm^2$, and preferably less than 0.5 $mm^2$.

In one aspect, the switch is an integrated circuit using a common substrate.

In one aspect, the switch is a silicon on insulator integrated circuit.

In one aspect, the adjustable element does not include any matching component to adapt electric impedance of the switch to the first electromagnetic element or to the second electromagnetic element, said matching component being a passive element such as a resistor, a capacitor, or an inductor.

In one aspect, the transistor structure includes a number of transistors less than or equal to eight transistors.

In one aspect, the transistor structure is a single pole single throw transistor structure.

In one aspect, the transistor structure is a double-shunt single pole single throw transistor structure.

In one aspect, the transistor structure is a single pole double throw transistor structure, or a single pole three throw transistor structure, or a single pole four throw transistor structure.

In one aspect, the first electromagnetic element is an electrical component made on the portion of the supporting substrate.

In one aspect, the first electromagnetic element is a string composed of a plurality of one or more delay lines and patch elements.

In one aspect, the patch element is a two layer element, comprising a first layer being a microstrip line connected in the string, and a second layer being a resonant element.

In one aspect, the first electromagnetic element is a two layer element, comprising a first layer having a parasitic element connected to the first port of the switch, and a second layer comprising a resonant element.

In one aspect, the second electromagnetic element is an electrical component made on the portion of the supporting substrate, said second electromagnetic element being a delay line, or a first or second electromagnetic element belonging to another adjustable element.

A second object of the invention relates to a wave shaping device for shaping an electromagnetic wave, said wave shaping device comprising:
- a tunable surface comprising a plurality of electromagnetic adjustable elements according to any of those disclosed herein, and configured to modify an impedance of said tunable surface, and a controller connected to the tunable surface and configured to control the states of the plurality of adjustable elements by parameters determined by said controller.

By these arrangements, the wave shaping device is also less costly than prior art devices.

In various embodiments of the wave shaping device, one or more of the following arrangements may be used.

In one aspect, the plurality of electromagnetic adjustable elements are organized in at least one chain, each electromagnetic adjustable element including a control unit, wherein the first control unit in the chain is connected to the controller and the other control unit in the chain are connected to a previous control unit in the chain, the control unit delivering the control signal to the control port of a corresponding switch on the bases of parameters from the controller.

In one aspect, the control unit and the switch of an electromagnetic adjustable element in the chain are integrated inside a same integrated circuit.

In one aspect, the tunable surface is included inside a reflective cavity.

In one aspect, the wave shaping device further comprises an active antenna to radiate a controlled electromagnetic wave towards the tunable surface, said active antenna being fed by an emitting signal for generating said controlled electromagnetic wave.

In one aspect, the wave shaping device is a purely passive device.

In one aspect, the wave shaping device further comprises a feeding network configured to distribute a controlled electromagnetic wave to the adjustable elements, said feeding network being fed by an emitting signal for generating said controlled electromagnetic wave.

In one aspect, the tunable surface comprises active adjustable elements that can radiate the electromagnetic wave.

BRIEF DESCRIPTION OF DRAWINGS

Other features and advantages of the invention will become apparent from the following description of one or more of its embodiments, given by way of non-limiting example, with reference to the accompanying drawings.

In the drawings:

FIG. 3 illustrates a switch as a single-shunt single-pole single-throw (SS-SPST) transistor structure;

FIG. 4 illustrates a switch as a double-shunt single-pole single-throw (DS-SPST) transistor structure;

FIG. 5 illustrates a switch as a single-pole double throw (SPDT) transistor structure;

FIG. 6 illustrates a switch as a single-pole double throw (SPDT) transistor structure, with quarter wavelength transmission lines;

In the various figures, the same numeric references are used to indicate identical or similar elements.

DETAILED DESCRIPTION

Figure 1:
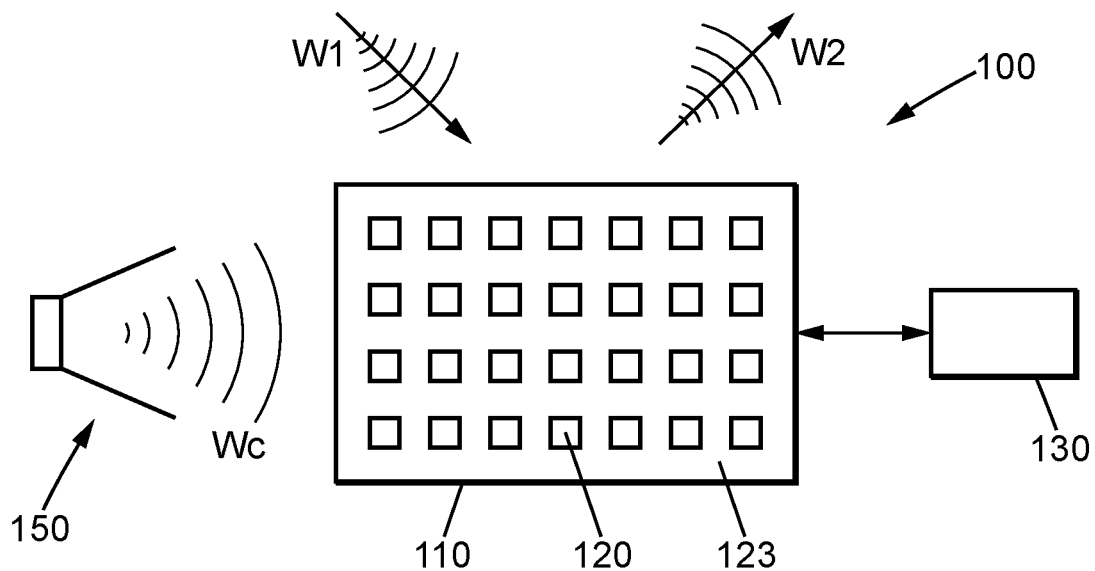
FIG. 1 is a schematic view of a first embodiment of a wave shaping device comprising a plurality of adjustable elements.

FIG. 1 illustrates a first embodiment of a wave shaping device 100 for shaping an electromagnetic wave. The wave shaping device 100 is configured to modify a first electromagnetic wave $W_1$ (incident wave) into a second electromagnetic wave $W_2$ (modified wave). In various literatures, such wave shaping devices can be called a Reconfigurable Intelligent Surface (RIS) or a Tunable Metasurface or a reconfigurable reflect array/transmit array. The wave shaping device may be used independently or not of the emitter of the first electromagnetic wave $W_1$.

The wave shaping device 100 comprises:
- a tunable surface 110 comprising a plurality of electromagnetic adjustable elements 120 configured to modify an electromagnetic impedance of the tunable surface 110, and
- a controller 130 connected by wire or wirelessly to the tunable surface 110 and configured to control the states of the plurality of electromagnetic adjustable elements 120 by parameters determined by the controller.

Depending on one of the parameters, each electromagnetic adjustable element 120 is able to be in a predetermined state that transmits and/or reflects and/or radiates a portion of the first electromagnetic wave $W_1$. The contributions of all electromagnetic adjustable elements 120 in the various states cause modification of the first electromagnetic wave $W_1$ into the second electromagnetic wave $W_2$.

The adjustable element 120 can be called an electromagnetic cell unit or an electromagnetic pixel in the literature.

The controller 130 is a processor or a microprocessor or a microcontroller or a programmable logic device such as a Field-programmable gate array (FPGA) or an Application Specific Integrated Circuit (ASIC) or any combination of them to control the tunable surface 110.

The wave shaping device 100 may be a purely passive device that only modifies the first electromagnetic wave $W_1$. It does not include in the tunable surface 110 (i.e., in the electromagnetic adjustable elements 120) any active element or active antenna that emits a new electromagnetic wave thanks to an input signal and input energy.

The wave shaping device 100 may be an active device comprising an active antenna 150 to radiate a controlled electromagnetic wave $W_c$ towards the tunable surface 110, said active antenna 150 being fed by an emitting signal for generating said controlled electromagnetic wave $W_c$.

The wave shaping device 100 may be an active device comprising a (microwave) feeding network distributing a controlled electromagnetic wave to each of the adjustable elements constituting the tunable surface. Said (microwave) feeding network is fed by an emitting signal for generating said controlled electromagnetic wave.

The wave shaping device 100 may be an active device comprising a tunable surface built of active adjustable elements that can radiate the electromagnetic wave.

Figure 2:
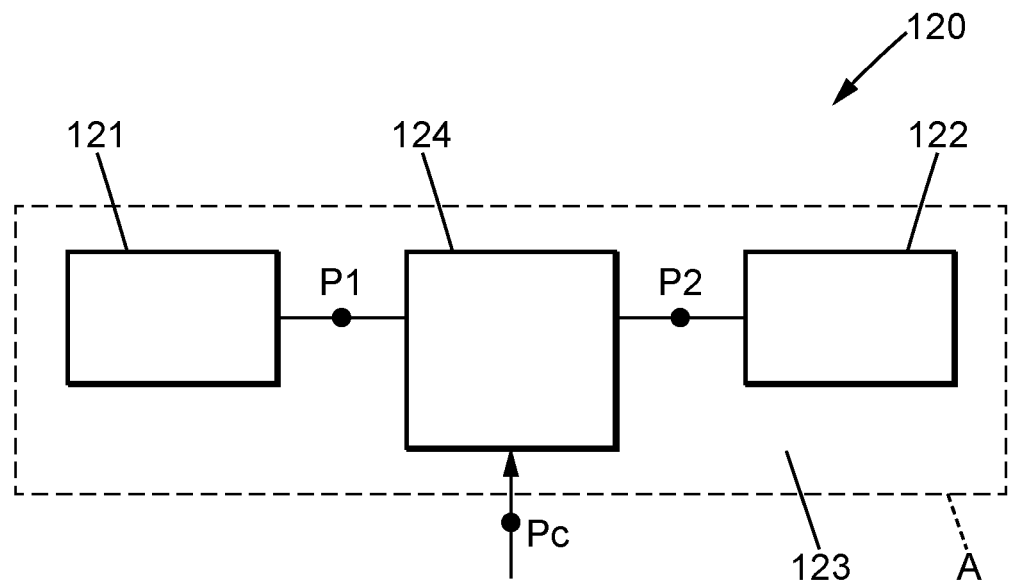
FIG. 2 is a schematic view of a first embodiment of an adjustable element comprising a switch, as included in the wave shaping device of FIG. 1.

As illustrated in FIG. 2, the electromagnetic adjustable element 120 is adapted to change the manner in which an electromagnetic wave is reflected and/or transmitted and/or radiated. The electromagnetic adjustable element 120 comprises:
- a first electromagnetic element 121 and a second electromagnetic element 122 made on an adjustable element area A that is a portion of a supporting substrate 123, and
- a switch 124 mounted on the adjustable element area of the supporting substrate.

The switch 124 comprises:
- a first port P1 configured to be connected to the first electromagnetic element 121,
- a second port P2 configured to be connected to the second electromagnetic element 122,
- a control port Pc configured to be fed by a control signal to control the switch.

The switch 124 is in:
- a connected state when the first electromagnetic element 121 is connected to the second electromagnetic element 122, or
- a disconnected state when the first electromagnetic element 121 is disconnected from the second electromagnetic element 122.

The switch 124 may comprise two ports or more for connecting electromagnetic elements. The control signal at control port Pc may be one bit or several bits of data corresponding to the number of ports that can be connected by the switch 124.

The control port Pc can be controlled directly or indirectly by the controller 130 of the wave shaping device 100.

The plurality of switches 124 in the wave shaping device 100 may be controlled from the controller 130 via a parallel structure or a series structure. In a parallel structure, each one of the electromagnetic adjustable elements 120 in the wave shaping device 100 is controlled directly by the controller 130. In a series structure, at least a group of electromagnetic adjustable elements 120 in the wave shaping device 100 are chained one to the other, and are controlled together from the controller 130. An embodiment of this series structure will be explained later in the current description.

Thanks to the switch 124, the electromagnetic wave is reflected and/or transmitted and/or radiated by said adjustable element 120 depending on the state of the switch (disconnected state or connected state of switch), and depending on the features of the first electromagnetic element 121 and of the second electromagnetic element 122.

The switch 124 according to the present disclosure is a transistor structure including transistors of low power type, said power being lower than 20 dBm.

The transistors of transistor structure may be of metal-oxide-semiconductor field-effect transistor (MOSFET) type, or complementary metal oxide semi-conductor (CMOS) type, or bipolar-CMOS type.

A CMOS transistor uses complementary and symmetrical pairs of p-type and n-type MOSFETs usually used for logic functions. CMOS transistors are used to build an integrated circuit (IC) chip.

The transistor power is the maximum electric power that the transistor can deliver at its output. This electric power is usually represented with a dBm value. The dBm value is a power value compared to a reference power value of 1 milliwatt (mW). This is a logarithm scale of electric power. For example, 0 dBm is 1 mW of electric power and +20 dBm is 100 mW of electric power.

More specifically, the transistor power is the output power of the transistor at its 1 dB compression point P1 dB. The 1 dB compression point P1 dB is the point in the transistor characteristic curve of input power versus output power, being the linear limit, or where the transistor becomes nonlinear: the output power at the 1 dB compression point P1 dB decreases of 1 dB from the value that would be given by the transistor constant gain.

The transistors in the transistor structure of switch 124 then have a 1 dB compression point P1 dB at a power level lower than 20 dBm.

Telecommunication devices usually use high power transistors so that to have a high level of emission power for an active antenna.

In the present wave shaping device, the transistors in the switch 124 are of low power type (lower than 20 dBm). Such low power switch 124 does not exist currently in the market as there is no use for such device.

In some uses or depending on the number of adjustable elements 120 in the wave shaping device 100, the power of transistors can be lower than 15 dBm or even lower than 10 dBm.

The cost of each switch 124 (transistor structure) can be low. Therefore, the cost of wave shaping device 100 including a plurality of switches 124 (each including one or more transistors) can also be low compared to prior art technical solutions. A wave shaping device 100 can now find a commercial market. Then, the wave shaping device 100 can be designed and optimized to the use of said switches 124.

Thanks to the switch 124 features, the switch 124 is an electronic component that is very simple and has a very small size. Therefore, such an electronic component can be produced on a large scale at a reduced price compared to prior art devices.

The supporting substrate 123 is a printed circuit board (PCB). The printed circuit board is for example a glass-reinforced epoxy laminate material composed of fiberglass embedded into an epoxy resin binder. Many grades of such laminate material exist, such as FR-4, FR-6, or G-10, and may be used for the supporting structure. Providers of these materials are for example Rogers Corp., Taconic PCB, or AGC (Meteorwave PCB).

Moreover, the transistors in the transistor structure are configured to be used at a frequency close to the cutoff frequency fc of the transistors. For example, the transistors are used at a frequency comprised between the cutoff frequency fc divided by three (3) and the cutoff frequency fc (between fc/3 and fc). According to a variant, the transistors are used at a frequency comprised between 0.5 fc and fc; and more specifically between 0.7 fc and fc.

Thanks to this feature, the transistors' size and efficiency are optimized. Then, the cost of switch 124 is reduced.

The switch 124 has a very small size. The switch 124 uses, for example, a switch area on the supporting substrate 123 of less than 1.5 mm². For example, in a square shape, the switch area is lower than 1.5 mm×1.5 mm, and eventually lower than 1 mm×1 mm.

Eventually, this switch area is even less than 0.5 mm². In a square shape, it could be lower than 0.5 mm×0.5 mm.

The switch area may have a square shape or a rectangular shape.

The switch area is substantially proportional to the number of transistors in the transistor structure multiplied by the etching fineness of these transistors.

In the disclosed switch 124, the etching fineness may be wide. For example, the etching fineness may be greater than 30 nm, or even greater than 90 nm. Thanks to this feature, the switch 124 is less expensive.

The switch 124 may be produced using an optimized and low cost process. For example, the switch 124 is an integrated circuit, a die, or a chip using a common substrate. The die is embedded into a package so as to be mounted or welded on the supporting substrate 123. In a variant, the die or chip is a silicon on insulator (SOI) integrated circuit. For example, companies X-FAB and GlobalFoundries can provide such CMOS SOI transistors technologies for the switch 124.

The switch 124 is a simple device, but also does not need any additional element that can be costly and use area on the supporting substrate 123. Indeed, with switch 124, the adjustable element 120 does not include any matching component to adapt the electric impedance of the switch to the first electromagnetic element or to the second electromagnetic element. Such matching components are usually used, for example, in PIN diode switches. The matching components may include at least one passive element such as a resistor, a capacitor, or an inductor, e.g., in the form of a resistance line, a capacitance line, or an inductance line. Thanks to the lack of matching components, the switch 124 can be configured more freely to a predefined impedance, such as a 50 Ohms impedance.

The CMOS transistors, as an electronic component, have some inner electric characteristics, such as resistance or capacitance at any of its input or output, said characteristics depending on the transistor state. However, these electric characteristics of the CMOS transistors are enough for the working of switch 124 connected to its first and second electromagnetic elements 121, 122. Therefore, the switch and adjustable element 120 do not have or do not include additional matching element to make the switch and its transistor structure work properly.

The CMOS transistor in switch 124 are for example transistors for a frequency band of Ku band, i.e., a frequency bandwidth of 10-15 GHz, or for a frequency band of Ka band, i.e., a frequency bandwidth of 17-31 GHz, or for a frequency band of W band, including the frequency bandwidth of 76-82 GHz, or any combination of above frequency bands. Especially, the 10 to 110 GHz frequency band is reachable. The switches may be specifically designed for a given frequency band.

The transistor's power is the maximum power value that can be delivered to the transistor inside its frequency band. For example, the CMOS transistor in switch 124 has a transistor power comprised between 5 dBm and 20 dBm. In a lower end variant (less consuming), the transistor power is lower than 10 dBm.

Consequently, the switch 124 of disclosed adjustable element 120 is simple, small in size, and low cost, but also does not induce additional cost or use of area around itself on the supporting substrate of the adjustable element 120.

The transistor structure of the switch 124 includes transistors of CMOS type, in a very simple structure.

The transistor structure includes a number of transistors less than or equal to eight transistors. More preferably, the number of transistors is less than or equal to four transistors.

Figure 3:
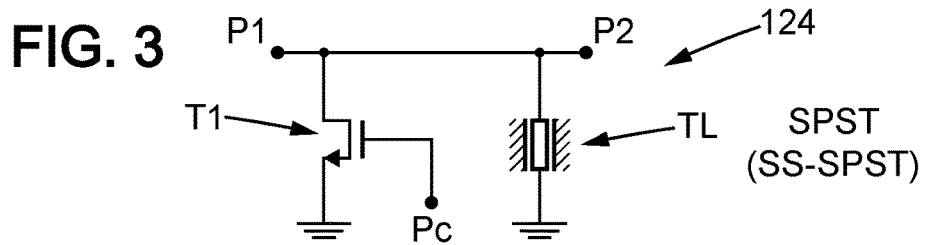
FIG. 3 to FIG. 6 are variants of a switch as included in the adjustable element of FIG. 2.
Figure 4:
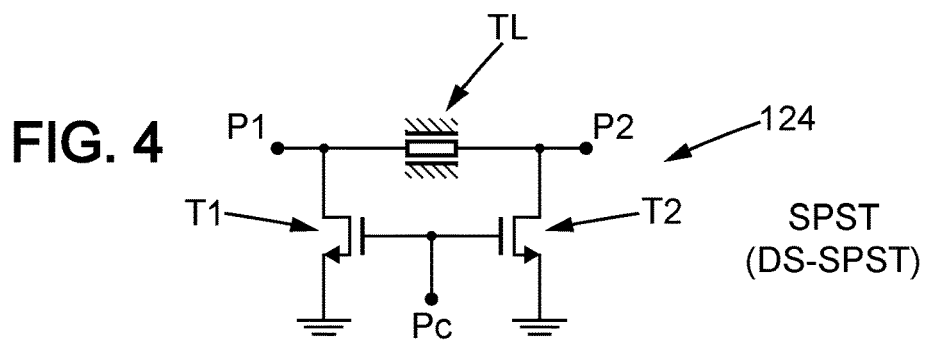

According to a first variant of the transistor structure, this transistor structure is a single pole single throw (SPST) transistor structure. This transistor structure comprises one input and one output. In FIG. 3 and FIG. 4, the input is, for example, the first port P1, and the output is the second port P2. The transistor structure comprises one or two transistors controlled via control port Pc.

Thanks to the SPST transistor structure, the electric power consumption is low, and the switch 124 can easily be in disconnected state with a high inner capacitance.

As illustrated on FIG. 3, the transistor structure may be a single-shunt single pole single throw (SS-SPST) transistor structure. This transistor structure includes only one transistor T1 connected in parallel with a stub or transmission line TL. The stub is characterized by an inductance, said inductance having a frequency resonance with the transistor electric capacitance in a blocking state of said transistor, thus providing high electric impedance. In a passing state of the transistor, an inner resistance of the transistor to ground is reduced providing low electric impedance.

As illustrated on FIG. 4, the transistor structure may be a double-shunt single pole single throw (DS-SPST) transistor structure. This transistor structure includes two transistors T1, T2 connected in parallel, these transistors being separated by a transmission line TL. The transmission line TL is characterized by an electric inductance. In a blocking state of the transistors, the two transistors T1, T2, and the transmission line TL are a π-CLC network providing a wide bandwidth. In a passing state of the transistors, their inner resistance provides good isolation.

The DS-SPST can be modified to work on a plurality of frequency bandwidths. In that case, several pairs of transistor branches are connected in parallel to the transmission line TL. Each pair of transistors are defined and controlled for one frequency band.

The SS-SPST transistor structure and the DS-SPST transistor structure, and more generally the SPST transistor structure, are well suited to all frequency bandwidths, and up to W band frequency bandwidth.

Figure 5:
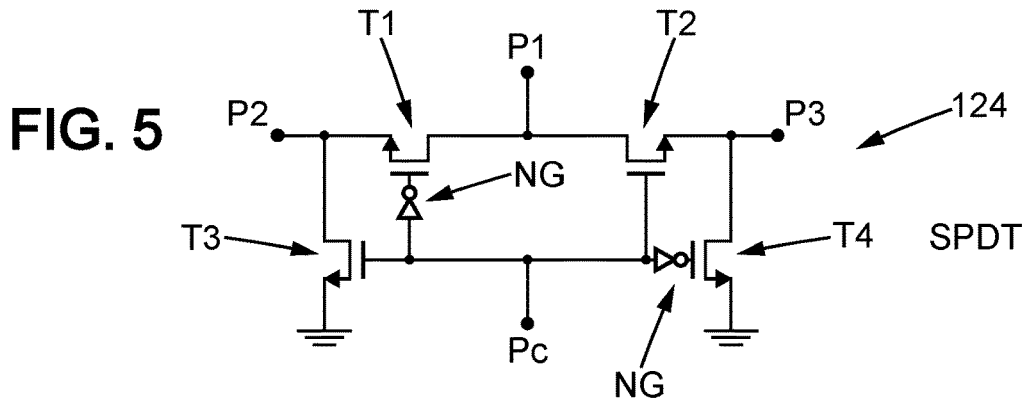
Figure 6:
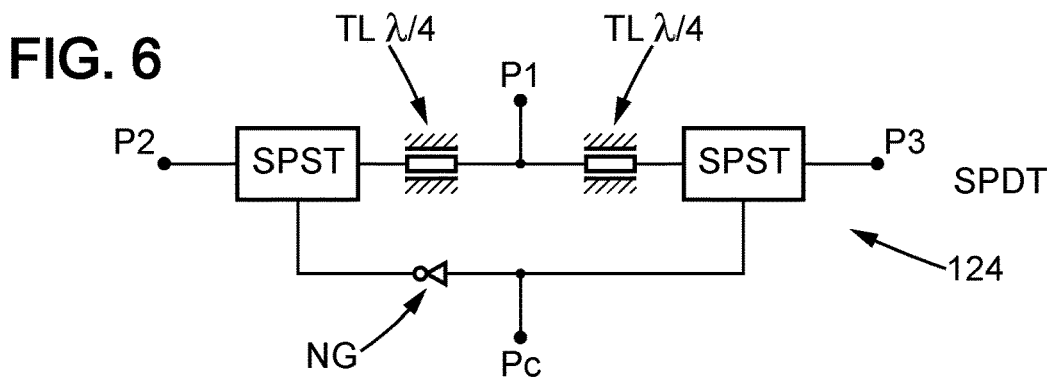

According to a second variant of the transistor structure, this transistor structure is a single pole double throw (SPDT) transistor structure. This transistor structure comprises one input and two outputs. In FIG. 5 and FIG. 6, the input is, for example, the first port P1, and the outputs are the second port P2 and the third port P3. The transistor structure comprises at least four transistors T1, T2, T3, and T4 controlled via control port Pc. A not gate NG may be connected to the base terminal of transistor T1 and T4 of FIG. 5 to invert the signal from the control port for these transistors.

In a further variant of SPDT, illustrated on FIG. 6, a quarter wavelength (λ/4) transmission line TL4 may be introduced between the input and each output in the transistor structure. λ is the wavelength of an electromagnetic wave travelling inside the switch 124 thanks to the first and second electromagnetic elements 121, 122.

The SPDT transistor structure is well suited to frequency bandwidth of W band and above.

According to another variant of the transistor structure, this transistor structure may have more than two outputs for being able to connect more electromagnetic elements. The transistor structure may be a single pole three throw (SP3T) transistor structure having one input and three outputs. The transistor structure may be a single pole four throw (SP4T) transistor structure having one input and four outputs. The transistor structure may have more than four outputs for being able to connect even more electromagnetic elements.

The first electromagnetic element 121 is an electrical component made on the portion of the supporting substrate 123 of the adjustable element 120. For example, the first electromagnetic element 121 is a copper area on the supporting substrate. The copper area may have various sizes or shapes depending on the desired electromagnetic characteristics of said first electromagnetic element 121 (frequency bandwidth, quality factor, etc.).

Figure 7:
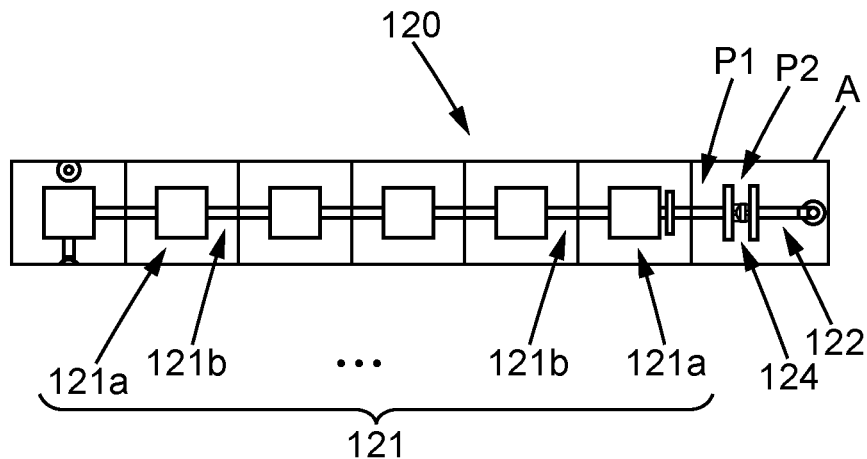
FIG. 7 is a first variant of a first electromagnetic element connected to the switch of the adjustable element.

According to a first variant of the first electromagnetic element 121, as illustrated on FIG. 7, the first electromagnetic element 121 is a string composed of a plurality of one or more delay lines 121*b* and patch elements 121*a*, connected alternatively one to another. For example, the string is composed of a series of a patch element 121*a*, a delay line 121*b*, a patch element 121*a*, a delay line 121*b*, etc. All these elements in the string are connected in series inside the adjustable element area A. At one end of the string, the first electromagnetic element 121 is connected to the first port P1 of the switch 124.

A patch element 121*a* in the string is an area of electrical conductive material. Its size and shape define the operating frequency of the patch element 121*a*, i.e., a frequency band. The distance between the patches 121*a* in the string defines a radiation pattern for the first electromagnetic element 121.

A delay line 121*b* is a wire of electrical conductive material, usually called a transmission line, or eventually a microstrip line.

This first variant of first electromagnetic element 121 is sometimes called a series-fed patch array. But, in the current disclosure, such first electromagnetic element 121 is connected by the switch 124 as disclosed above.

Figure 8:
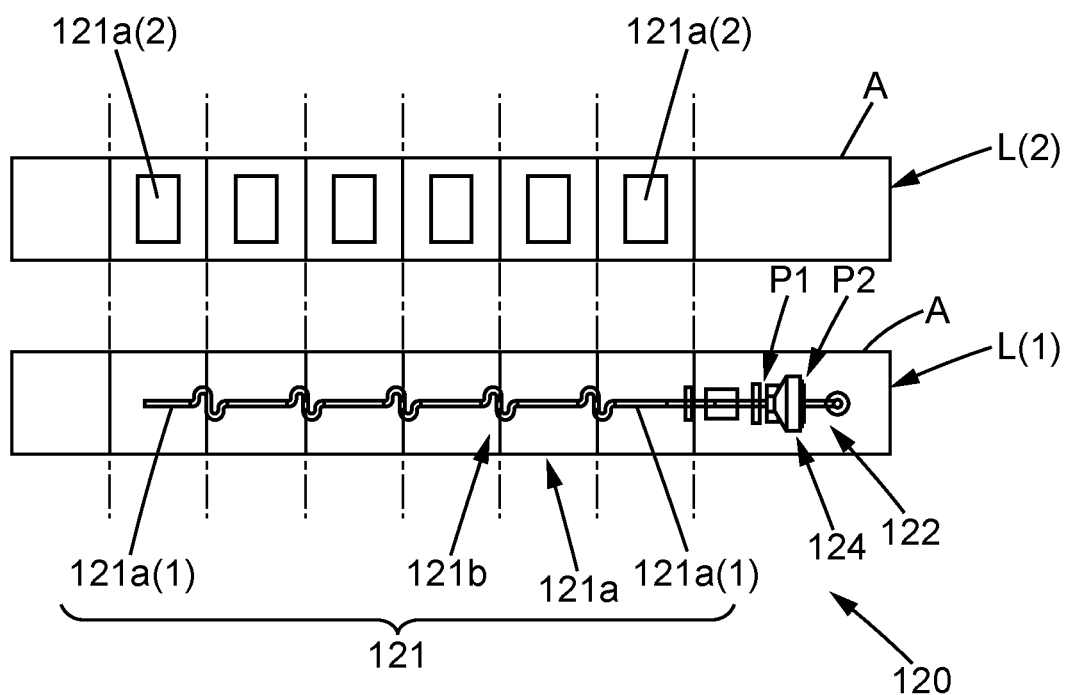
FIG. 8 is a second variant of a first electromagnetic element connected to the switch of the adjustable element.
Figure 9:
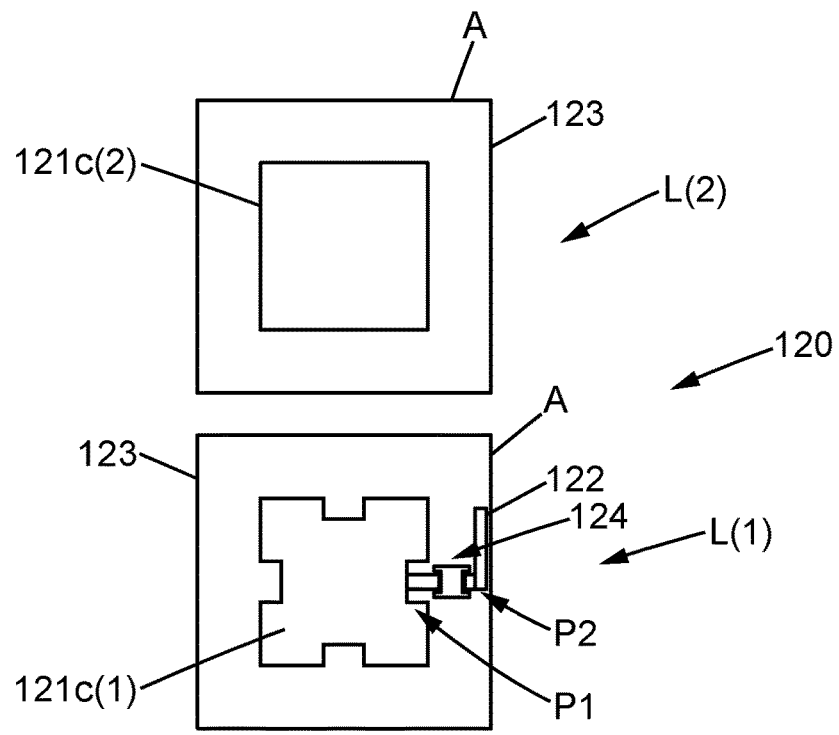
FIG. 9 is a third variant of a first electromagnetic element connected to the switch of the adjustable element.

According to a second variant of the first electromagnetic element 121, as illustrated on FIG. 8, the first electromagnetic element 121 is a two layer element, comprising a first layer L(1) and a second layer L(2). The two layers are separated by an interlayer distance. These layers for example correspond to two layers in the supporting substrate 123 of the adjustable element 120. This FIG. 9 shows these two layers in a flat view, the two layers L(1), L(2) being side by side for ease of understanding. But the second layer L(2) must be superposed above the first layer L(1).

In this second variant, the first electromagnetic element 121 is also a string composed of a plurality of one or more patch elements 121*a* and delay lines 121*b*, connected alternatively one to another. However, the patch elements 121*a* are composed of a microstrip element 121*a*(1) on the first layer and connected to the string, and a resonant element 121*a*(2) on the second layer.

The microstrip line 121*a*(1) on the first layer is electromagnetically coupled to the resonant element 121*a*(2) of the second layer. For example, between them a slot or third layer is causing the electromagnetic coupling.

The resonant element 121*a*(2) is an area of conductive material. Like the patches in the first variant, the resonant element 121*a*(2) size and shape defines the operating frequency, i.e., a frequency band. The distance between the resonant elements 121*a*(2) in the string defines a radiation pattern for the first electromagnetic element 121. However, the resonant element 121*a*(2) in this second variant is an element independent to the string: it is not electrically connected to the string, but it is electromagnetically coupled to a corresponding microstrip line 121*a*(1) in the string.

A delay line 121*b* is a wire of electrically conductive material. In the disclosed second variant, this delay line has a sinus wave shape. However, many shapes may be applied and need to be optimized for first electromagnetic element characteristics.

According to a third variant of the first electromagnetic element 121, as illustrated on FIG. 9, the first electromagnetic element 121 is a two layer element, comprising a first layer L(1) and a second layer L(2). The two layers are separated by an interlayer distance. These layers for example correspond to two layers in the supporting substrate 123 of the adjustable element 120. FIG. 9 shows these two layers in a flat view, the two layers L(1), L(2) being side by side for ease of understanding. But the second layer L(2) must be superposed above the first layer L(1).

In this third variant, the first electromagnetic element 121 is not a string but a single patch element. The first electromagnetic element 121 comprises a parasitic element 121*c*(1) on the first layer, said parasitic element 121*c*(1) being connected to the first port P1 of the switch 124, and a resonant element 121*c*(2) on the second layer.

The parasitic element 121*c*(1) size and shape defines the operating frequency, i.e., a frequency band, in high-Q resonance or high quality factor (Q factor). The resonant element 121*c*(2) size and shape defines the operating frequency, i.e., a frequency band, in low-Q resonance or low quality factor.

However, the resonant element 121*c*(2) in this third variant is an element independent to the parasitic element 121*c*(1): it is not electrically connected to the parasitic element 121*c*(1), but it is electromagnetically coupled to a corresponding parasitic element 121*c*(1).

In the specific illustrated embodiment of FIG. 9, the resonant element 121*c*(2) is a square shape conductor material, and the parasitic element 121*c*(1) is a square shape conductor material having a recess where it is connected to the switch 124.

Figure 10:
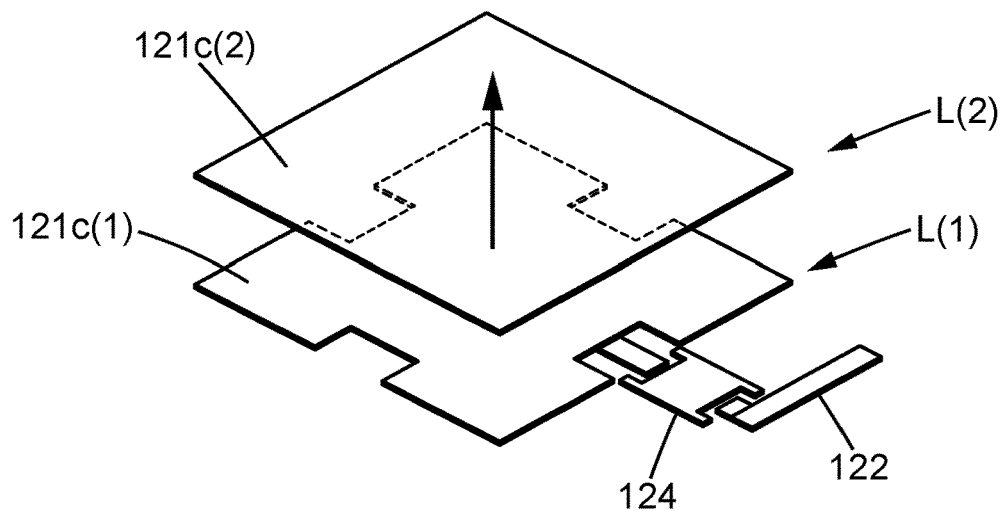
FIG. 10 is a perspective view of the first electromagnetic element of FIG. 9.

FIG. 10 shows a perspective view of adjustable element 120 of FIG. 9, viewing the superposition of second layer L(2) above first layer L(1).

All these variants of first electromagnetic element 121 are for illustration. Many other known variants can be used in the adjustable element 120 of this disclosure, i.e., with a CMOS low power switch.

The second electromagnetic element 122 is also an electrical component made on the portion of the supporting substrate 123. For example, the second electromagnetic element 122 is a copper area on the supporting substrate. The copper area may have various sizes or shapes depending on the desired electromagnetic characteristics of said second electromagnetic element 122 (frequency bandwidth, quality factor, etc.).

This second electromagnetic element 122 can be of any type as disclosed above for the first electromagnetic element 121, or of any known type.

According to the variants disclosed on FIG. 7, FIG. 8, and FIG. 9, and as a more usual case, the second electromagnetic element 122 is a delay line that defines a phase shift of an electromagnetic wave between the connected state and the disconnected state of the switch 124.

According to other variants, the second electromagnetic element 122 is a first or second electromagnetic element belonging to another adjustable element 120'. The adjustable elements 120 in the wave shaping device are not independent one to the other but connected one to the other. In fact, two neighbor adjustable elements 120, 120' might be connected one to the other through a switch 124. The wave shaping device 100 is then a matrix of interconnected adjustable elements 120.

We are now going back to the description of wave shaping device 100 and the adjustable elements 120.

Figure 11:
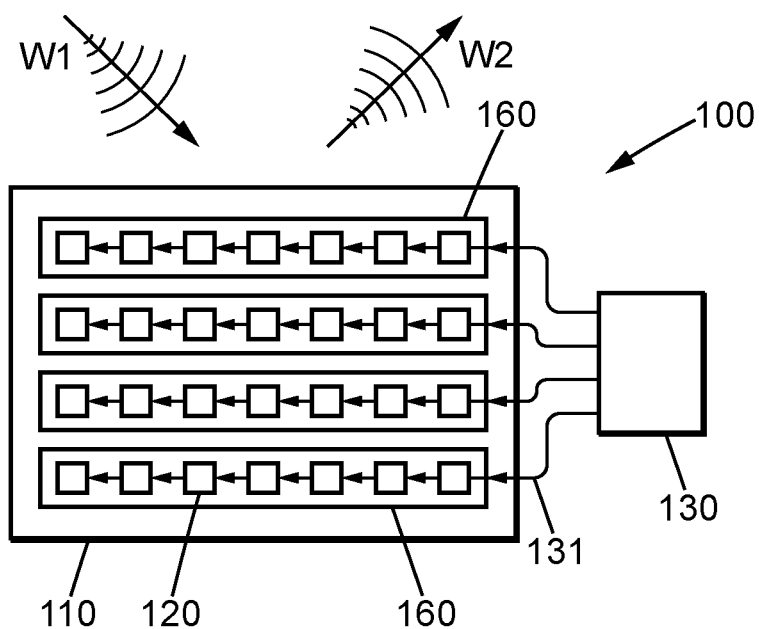
FIG. 11 is a schematic view of a second embodiment of a wave shaping device comprising a plurality of adjustable elements and a chain organization of said adjustable elements.

FIG. 11 illustrates a second embodiment of a wave shaping device 100 for shaping an electromagnetic wave. The wave shaping device 100 of this second embodiment includes all features of the one in the first embodiment.

In this second embodiment, the plurality of adjustable elements 120 are organized in or grouped in at least one chain 160 for their connection to the controller 130 by the link 131. In that configuration, the control port Pc of the switches 124 in the adjustable elements 120 is controlled indirectly by the controller 130.

As illustrated on the figure, the plurality of adjustable elements 120 in the wave shaping device 100 are organized in or grouped in a plurality of chains 160, each chain being connected to the controller 130. This plurality of chains 160 is then connected to the controller 130 in parallel to each other, by several links 131.

Figure 12:
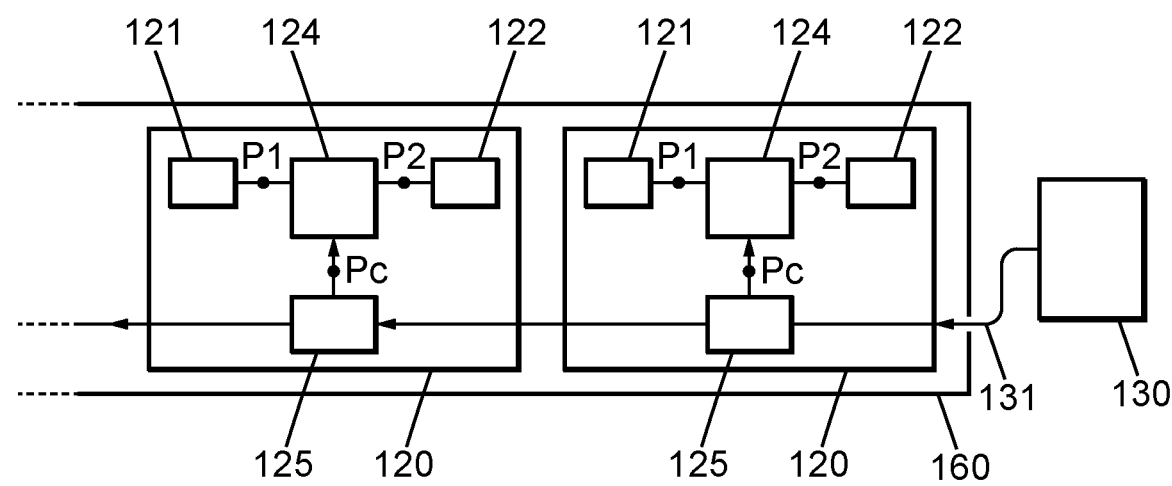
FIG. 12 is a schematic view of a second embodiment of an adjustable element comprising a switch, as included in the wave shaping device of FIG. 11.

FIG. 12 gives a more detailed view of two adjustable elements 120 connected one to the other in the chain 160. In this embodiment, each adjustable element 120 further includes a control unit 125. The first control unit 125 (on the right in FIG. 12) in the chain 160 is connected to the controller 130 by link 131 and the next control unit 125 (on the left in FIG. 12) in the chain 160 is connected to the previous control unit (in that case the first one). Each control unit 125 receives the needed values from the controller and delivers the control signal to the control port Pc of a corresponding switch 124 on the basis of parameters transmitted from the controller 130 via the link 131.

Thanks to such a chained organization, the number of links between the controller 130 and the adjustable elements 120 is reduced compared to a direct link organization or compared to a matrix organization.

Figure 13:
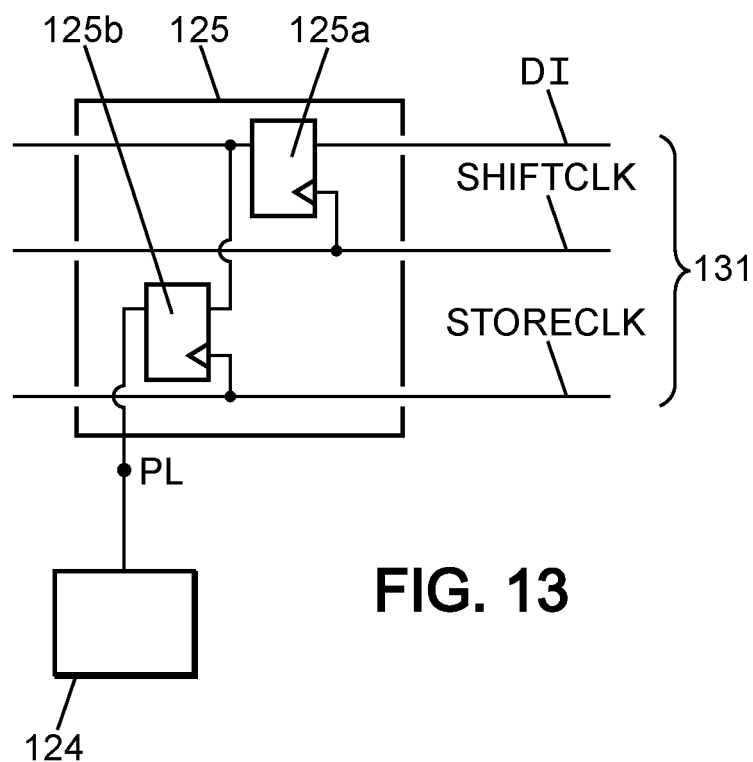
FIG. 13 is a schematic view of a control unit used in the adjustable element of FIG. 12.

An example of an embodiment of one control unit 125 is disclosed on FIG. 13. In this example, the link 131 includes:
- a data input line DI providing data values of parameters from the controller 130,
- a shift clock line SHIFTCLK being fed by a signal for shifting the data of a data input line from one control unit 125 to a next control line in the chain 160,
- a storing clock line STORECLK being fed by a signal for pushing the current data in the control unit 125 to the control port PC of the connected/corresponding switch 124 of said control unit 125.

In the above purpose, the control unit 125 comprises for example:
- a first circuit 125a, such as a first delay flip flop DFF circuit, for driving the shifting of data on the data input line DI when a rising or falling signal happened on the signal of the shift clock line SHIFTCLK, and
- a second circuit 125b, such as a second delay flip flop DFF circuit, for storing the current data value from the first circuit 125a when a rising or falling signal happened on the signal of the storing clock line STORECLK, and for delivering said data value to the control port PC of connected switch 124.

Thanks to the above features, and the corresponding signals on shift clock line SHIFTCLK, and storing clock line STORECLK, the data values can be pushed from the controller 130 to all the control units 125. When correctly positioned in the chain 160, the data values are simultaneously sent to all the switches 124 in the chain 160.

This embodiment of control unit 125 is only an example, and many other signals and circuits can be combined for the same purpose.

According to a variant of the above shaping device 100, a control unit 125 and a switch 124 are integrated inside one chip. This integrated circuit chip is a MOSFET, a CMOS, or a bipolar CMOS chip.

Thanks to this integration, only one chip (integrated circuit) is mounted on the supporting substrate 123 for each adjustable element 120. The manufacturing of wave shaping device 100 is simplified and less costly.

There are also many variants of the wave shaping device depending on the use of said wave shaping device 100 and the tunable surface 110.

According to a variant of the shaping device 100, the tunable surface 110 is included inside a reflective cavity.

According to a variant of the shaping device 100, it further includes aa active antenna 150 (as shown on FIG. 1) to radiate a controlled electromagnetic wave We towards the tunable surface 110. The active antenna 150 is fed by an emitting signal for generating the controlled electromagnetic wave.

A wave shaping device 100 as disclosed above may include a huge number of electromagnetic adjustable elements 120. For example, the number is higher than hundreds (100), or even higher than a thousand (1000). As a consequence, power can be spread among this number of electromagnetic adjustable elements 120. As a consequence, the power at the input of each one of these electromagnetic adjustable elements 120 is much lower, by 1 or 3 orders of magnitude, as compared to the power at the input of a radio frequency switch in common antenna applications. Therefore, in wave shaping device 100, switches with a much lower power limit and much lower performance can be used.

Transistors of low power, i.e., with a power limit lower than 20 dBm, or a 1 dB compression point lower than 20 dBm, can be used in a wave shaping device 100 and an electromagnetic adjustable element 120. This power limit can be even lower, for example, lower than 15 dBm, depending on the application and number of electromagnetic adjustable elements 120 in the wave shaping device 100.

Isolation can also be relaxed since there is no need to switch between a high power circuit and a low power one, and hence isolation typically higher than −20 dBm can be used.

Also, there is no need in these circuits, because the properties are much more relaxed due to the low power and hence low performance required, for matching circuits such as microstrip filters in the form of inductance or stubs in semiconductor. All of the new characteristics imply that it is possible, for these specific applications, to design a radio frequency switch with few transistors that are rather small, without matching circuits. In doing so, it is then possible to realize switches onto dies that are smaller than 1.5 mm$^2$, or even smaller than 1 mm$^2$.

Such a simplified switch can lower the price of wave shaping devices/reconfigurable surfaces.

Moreover, smaller switches imply lower dissipation, which is extremely important at high frequencies. This is also of importance at millimeters wavelengths to keep the size of switch 124 very low compared to the size of an electromagnetic adjustable element 120.

The invention claimed is:

1. An electromagnetic adjustable element that is adapted to change the manner in which an electromagnetic wave is reflected and/or transmitted and/or radiated, said adjustable element comprising:
- a first electromagnetic element and a second electromagnetic element made on an adjustable element area (A) that is a portion of a supporting substrate, and
- a switch mounted on the adjustable element area of the supporting substrate, the switch comprising:
  - a first port (P1) configured to be connected to the first electromagnetic element,
  - a second port (P2) configured to be connected to the second electromagnetic element,
  - a control port (Pc) configured to be fed by a control signal to control the switch, and wherein the switch is in a connected state when the first electromagnetic element is connected to the second electromagnetic element, and the switch is in a disconnected state when the first electromagnetic element is disconnected to the second electromagnetic element, so that the electromagnetic wave is reflected and/or transmitted and/or radiated by said adjustable element depending on the disconnected state or connected state of the switch, the adjustable element being characterized in that the switch is a transistor structure including transistors of low power type, said power being lower than 20 dBm.

2. The adjustable element according to claim 1, wherein the transistors of transistor structure are of MOSFET type, or CMOS type, or bipolar-CMOS type.

3. The adjustable element according to claim 1, wherein the switch is an integrated circuit using a common substrate.

4. The adjustable element according to claim 3, wherein the switch is a silicon on insulator (SOI) integrated circuit.

5. The adjustable element according to claim 1, wherein the adjustable element does not include any matching component to adapt electric impedance of the switch to the first electromagnetic element or to the second electromagnetic element, said matching component being a passive element such as a resistor, a capacitor, or an inductor.

6. The adjustable element according to claim 1, wherein the transistor structure includes a number of transistors less or equal to eight transistors.

7. The adjustable element according to claim 1, wherein the transistor structure is a single pole single throw (SPST) transistor structure.

8. The adjustable element according to claim 1, wherein the transistor structure is a double-shunt single pole single throw (DS-SPST) transistor structure.

9. The adjustable element according to claim 1, wherein the transistor structure is a single pole double throw (SPDT) transistor structure, or a single pole three throw (SP3T) transistor structure, or a single pole four throw (SP4T) transistor structure.

10. The adjustable element according to claim 1, wherein the first electromagnetic element is an electrical component made on the portion of the supporting substrate.

11. The adjustable element according to claim 10, wherein the first electromagnetic element is a string composed of a plurality of one or more delay lines and patch elements.

12. The adjustable element according to claim 11, wherein the patch element is a two layer element, comprising a first layer being a microstrip line connected in the string, and a second layer being a resonant element.

13. The adjustable element according to claim 10, wherein the first electromagnetic element is a two layer element, comprising a first layer having a parasitic element connected to the first port (P1) of the switch, and a second layer comprising a resonant element.

14. The adjustable element according to claim 1, wherein the second electromagnetic element is an electrical component made on the portion of the supporting substrate, said second electromagnetic element being a delay line, or a first or second electromagnetic element belonging to another adjustable element.

15. A wave shaping device for shaping an electromagnetic wave, the wave shaping device comprising:
a tunable surface comprising a plurality of electromagnetic adjustable elements according to claim 1, and configured to modify an impedance of said tunable surface, and
a controller connected to the tunable surface and configured to control the states of the plurality of adjustable elements by parameters determined by said controller.

16. The wave shaping device according to claim 15, wherein the plurality of electromagnetic adjustable elements are organized in at least one chain (160), each electromagnetic adjustable elements including a control unit, wherein the first control unit in the chain is connected to the controller and the other control unit in the chain are connected to a previous control unit in the chain, the control unit delivering the control signal to the control port (Pc) of a corresponding switch on the bases of parameters from the controller.

17. The wave shaping device according to claim 16, wherein the control unit and the switch of an electromagnetic adjustable element in the chain (160) are integrated inside a same integrated circuit.

18. The wave shaping device according to claim 15, wherein the tunable surface is included inside a reflective cavity.

19. The wave shaping device according to claim 15, further comprising an active antenna (150) to radiate a controlled electromagnetic wave ($W_c$) towards the tunable surface, said active antenna being fed by an emitting signal for generating said controlled electromagnetic wave.

20. The wave shaping device according to claim 15, wherein the wave shaping device is a purely passive device.

21. The wave shaping device according to claim 15, further comprising a feeding network configured to distribute a controlled electromagnetic wave to the adjustable elements, said feeding network being fed by an emitting signal for generating said controlled electromagnetic wave.

22. The wave shaping device according to claim 15, wherein the tunable surface comprises active adjustable elements that can radiate the electromagnetic wave.

23. The adjustable element according to claim 1, wherein the switch has a switch area on the supporting substrate of less than 1.5 mm$^2$ and preferably less than 0.5 mm$^2$.

* * * * *